United States Patent [19]

Hsia

[11] 4,268,328
[45] May 19, 1981

[54] STRIPPED NITRIDE MOS/MNOS PROCESS
[75] Inventor: Yukun Hsia, Santa Ana, Calif.
[73] Assignee: McDonnell Douglas Corporation, Long Beach, Calif.
[21] Appl. No.: 115,186
[22] Filed: Jan. 25, 1980

Related U.S. Application Data

[62] Division of Ser. No. 898,649, Apr. 21, 1978.
[51] Int. Cl.³ .................................... H01L 21/22
[52] U.S. Cl. .................................. 148/187; 29/571; 148/188; 148/189
[58] Field of Search .................. 148/187, 188, 189; 357/23; 29/571

[56] References Cited

U.S. PATENT DOCUMENTS 3,719,866  3/1973  Naber et al. .................... 357/23
3,836,894  9/1974  Cricchi ............................ 357/23 X
4,148,049  4/1979  Cricchi et al. ................... 357/23

Primary Examiner—G. Ozaki
Attorney, Agent, or Firm—Henry M. Bissell; Walter J. Jason; Donald L. Royer

[57] ABSTRACT

A method for fabricating MOS and MNOS transistors on a common substrate which strips the silicon nitride required for MNOS operation away from areas where it is not required. The removal of the nitride from the MOS gate eliminates cumulative threshold instability and allows separate optimization of both MOS and MNOS structures in a single process. Removal of nitride from other areas such as the contact regions prevents undercut structures of nitride dielectric from being formed during contact hole fabrication and thus minimizes reliability problems and yield limitations. Further an improved MNOS structure is produced which has strips of nitride in the gate region spaced apart from the diffused regions, thereby minimizing diode breakdown and long term threshold instability.

8 Claims, 11 Drawing Figures

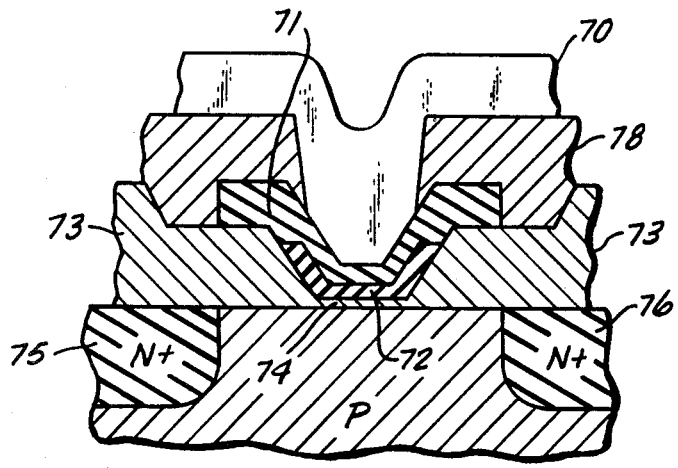
FIG.—7
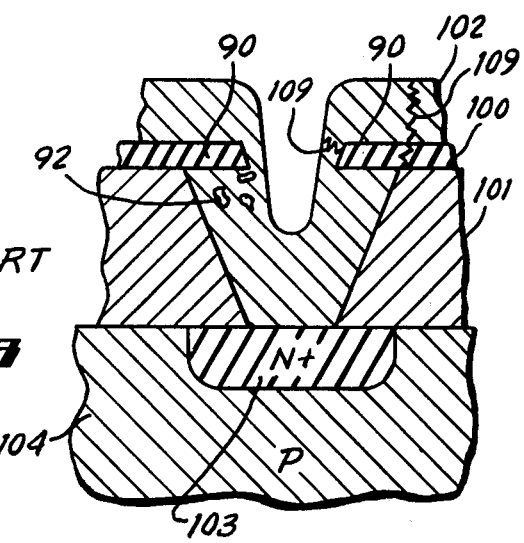
PRIOR ART
FIG.—8
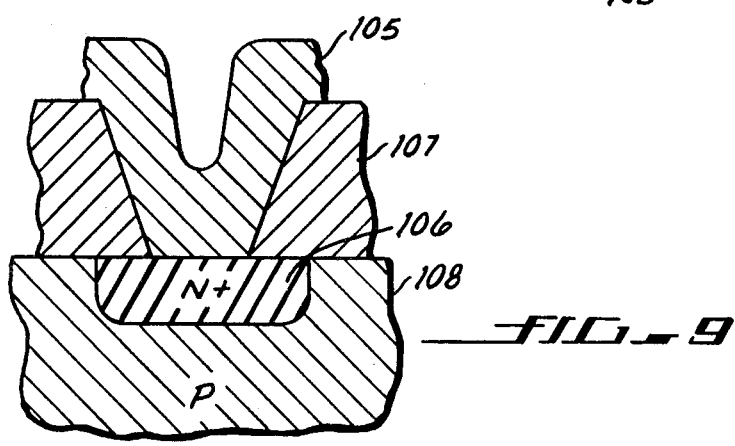
FIG.—9

STRIPPED NITRIDE MOS/MNOS PROCESS

This is a division, of application Ser. No. 898,649, filed Apr. 21, 1978.

BACKGROUND OF THE INVENTION

This invention relates to the field of nonvolatile semiconductor memory devices and nonmemory transistors fabricated on the same substrate. More particularly, this invention relates to improved method and structure for fabrication of nonvolatile semiconductor memory devices of the metal nitride oxide silicon (MNOS) type, metal or silicon gate; nonmemory MOS including silicon gate and a method of fabricating both on the same substrate.

PRIOR ART

Existing MNOS product devices such as NCR 2401, 3400, Nitron NCM 7040, 7050 utilize a dual dielectric for the gate of nonmemory transistors. A dual dielectric gate, however, is known to have some degree of threshold instability. In fact, it is this instability that is utilized to some degree in the operation of MNOS memory devices.

The typical procedure in the fabrication in both MNOS and MOS devices on the same substrate is to deposit the nitride layer required for MNOS operation across the entire wafer, thus causing two layers of dielectric in the MOS device, one of silicon dioxide and the other silicon nitride. After long operation of such MOS devices, however, threshold instability problems occur, due to an accumulation of charge at the interface such that the MOS devices tend to act like MNOS devices at undesirable threshold levels. Such reliability problems are caused after repeated electrical stress over a long period of time on the dual dielectric and therefore instability of threshold becomes a long term reliability problem. This reliability problem is caused essentially by the hysteresis effect inherent in the structure, that is, charges tend to become trapped cumulatively over a period of time.

The typical prior art structures attempt to minimize the effect of this problem by making the silicon dioxide in the gate area of the MOS device quite thick, on the order of several hundred Angstroms. This, however, introduces two additional problems. First, the device size is restricted to specific dimensions thereby restricting reduction of device geometry. Second, greater voltage and power requirements are necessary and reduced speed is experienced in operation of devices having a thick gate dielectric.

It should be noted that these attempts have only minimized the problem and, as indicated before, instability still occurs over an extended period of operation. Further, when size reduction of the MNOS device is attempted, the dielectric interface tends to approach the diffusion regions and thus creates an area wherein charges may be trapped in close proximity to the source or drain regions. This causes the resistivity in those areas to be reduced. Correspondingly, this causes the voltage at which the diode formed by the source or drain of the device with the substrate will break down to be reduced. This effect is known as pinning of the electric field at the source or drain regions and results in an undesirable breakdown as conduction to the substrate occurs, depending on the applied potential, of course, and thus interferes with operation of the device.

Accordingly, individual devices may not be optimized because when it is desired to reduce the size of the MNOS devices, the adjacent MOS structures then exhibit the threshold instability and source or drain breakdown heretofore described. When the MOS structure is optimized to eliminate the threshold instability, then the resultant MNOS geometry suffers undesirable traits such as increased operating voltages, reduced speed and the like. Thus, it is highly advantageous to optimize the MNOS and MOS devices independently when fabricating the same on a common substrate.

In existing processes where the entire wafer is covered with a nitride layer the creation of openings for contact holes or for diffusion processes requires the etching away of the silicon nitride layer in the area of interest. A different etch which does not affect the nitride layer itself is used to etch the silicon dioxide beneath the nitride layer in order to reach the area where the contact is to be made or the diffusion is to take place. Unfortunately, the silicon dioxide is etched away horizontally as the desired vertical etch is accomplished. This creates a nitride ledge overlapping the hole in the oxide thereby created. The ledges are very fragile, crack and often break off. They then tend to migrate about the chip surface, causing breaks in electrical contact or otherwise contaminating or interfering with the fabrication and later functioning of neighboring circuitry. In addition, the trapping of impurities of one kind or another can occur under the ledges when the contact is made, causing instability or otherwise interfering with the circuit operation.

SUMMARY OF THE INVENTION

A nitride stripping step is incorporated in the complete MNOS processing sequence of steps. Included in the particular processing step is the masking of the nitride gate or surface in strips which interconnect each MNOS device or extend well beyond the gate area. The remaining nitride is stripped away by an etch process such as a plasma etch. The photoresist or other mask is then stripped away and the remaining nitride cleaned and inspected. The process is not limited to the specific structure but includes the fabrication of metal gate MNOS and silicon gate MNOS devices of all kinds. In addition, the invention is applicable to other than silicon technology, such as a gallium arsenide, for example. Further, the invention is not limited to LSI devices but is applicable in all fields utilizing the MNOS structure regardless of the size or complexity of the particular circuit. The primary process feature of this invention is the addition of a novel set of processing steps to an MNOS process to eliminate the nitride dielectric where it is not needed. The features include a change in the geometry of the MNOS memory transistor which has nitride dielectric only in a predetermined region of the transistor gate region and a change in the geometry of the nonmemory device which has no nitride dielectric in the transistor gate. Therefore, as the device geometry continues to shrink as fabrication techniques are improved, both MNOS and nonmemory devices may be fabricated on the same substrate and indeed in juxtaposition with one another in increasingly smaller geometry without the instability normally resulting from the dual dielectric created in the nonmemory gate or the breakdown problems at the source and drain regions of the memory or nonmemory device. In addition, since contact openings need not be cut through a nitride dielectric layer, the possibility of undercut due to the existence of nitride ledges in the contact hole conduit is eliminated in all contacts. This results not only in greater stability at the contact hole location but also results in increased yield due to the fact that fractured ledges are not present to migrate during the manufacturing process and contaminate or otherwise interfere with adjacent circuit fabrication or subsequent operation.

Accordingly, it is an object of this invention to provide a method which improves the structure of the MNOS device in that the nitride layer is essentially only in the gate area. Thus as the overall size of the MNOS device becomes smaller there is no danger of breakdown in the source or drain regions caused by the cumulative effect of charge trapping occurring at the nitride oxide interface over the diffused regions.

It is a further object of this invention to eliminate nitride dielectric across the surface of adjacent circuitry, thereby eliminating undercut structure which presents the reliability problems, yield limitations, and tolerance overlaps for contacts. It is a further object of this invention to provide a process whereby the nitride dielectric elimination permits the independent reduction of nonmemory transistor gate dielectric thickness to optimize transistor device parameters, and the independent adjustment of memory transistor nitride gate dielectric thickness for threshold controls.

It is a further object of the instant invention to eliminate the nitride layer in the gate of MOS devices constructed simultaneously with MNOS devices. Therefore no trapping of charges can occur and the leakage path problem as well as threshold instability is thereby minimized as the MOS transistor geometry continues to be reduced in size. Even the slope or the sidewalk effect of the MNOS device is minimized due to the fact that the slope of the sidewalk becomes less and less as device geometry becomes smaller.

BRIEF DESCRIPTION OF THE DRAWINGS

FIG. 7 is a partial cross-sectional view of the ideal silicon gate area of the MNOS device of the instant invention;

FIG. 8 is a cross-sectional objective view of the prior art structure;

FIG. 9 is a partial cross-sectional objective view of the instant invention showing a portion of an adjacent gate;

SPECIFIC EMBODIMENT

Figure 1:
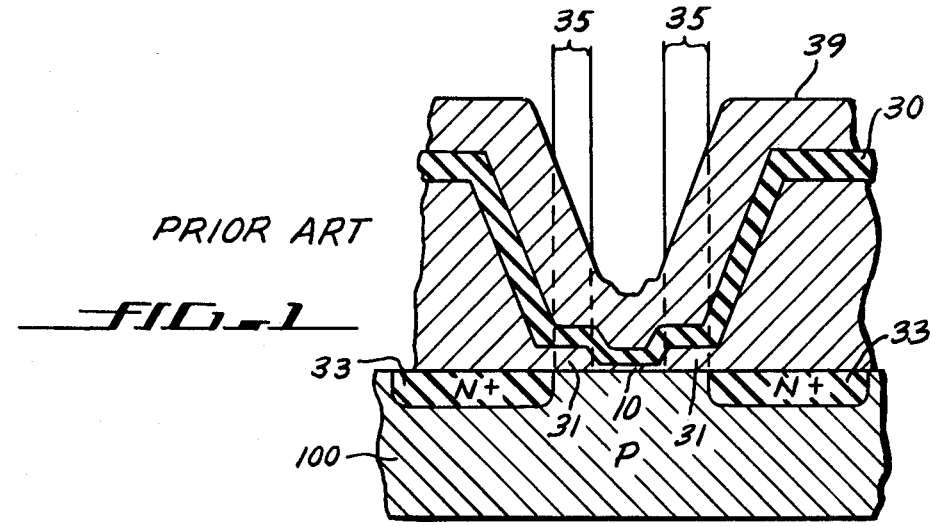
FIG. 1 is a partial cross-sectional view of the prior art MNOS structure.
Figure 2:
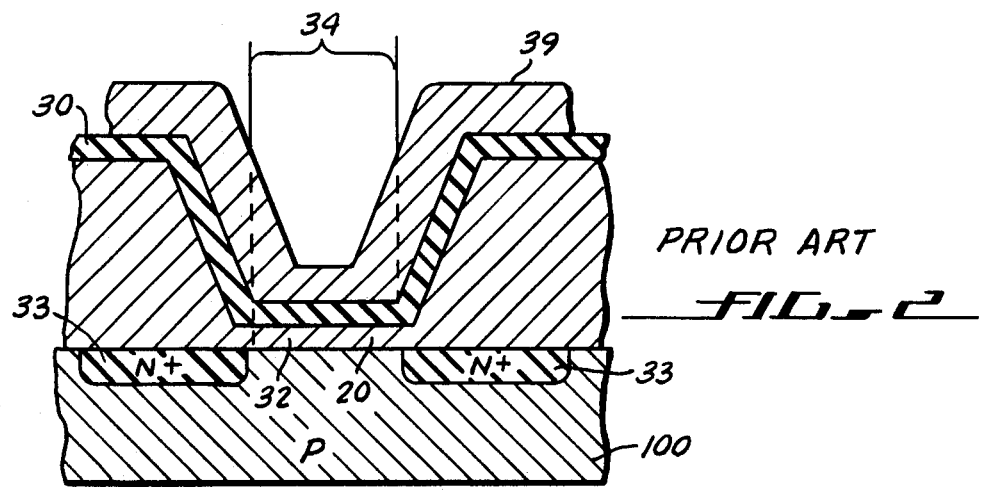
FIG. 2 is a partial cross-sectional view of the prior art MOS structure.
Figures 10, 11:
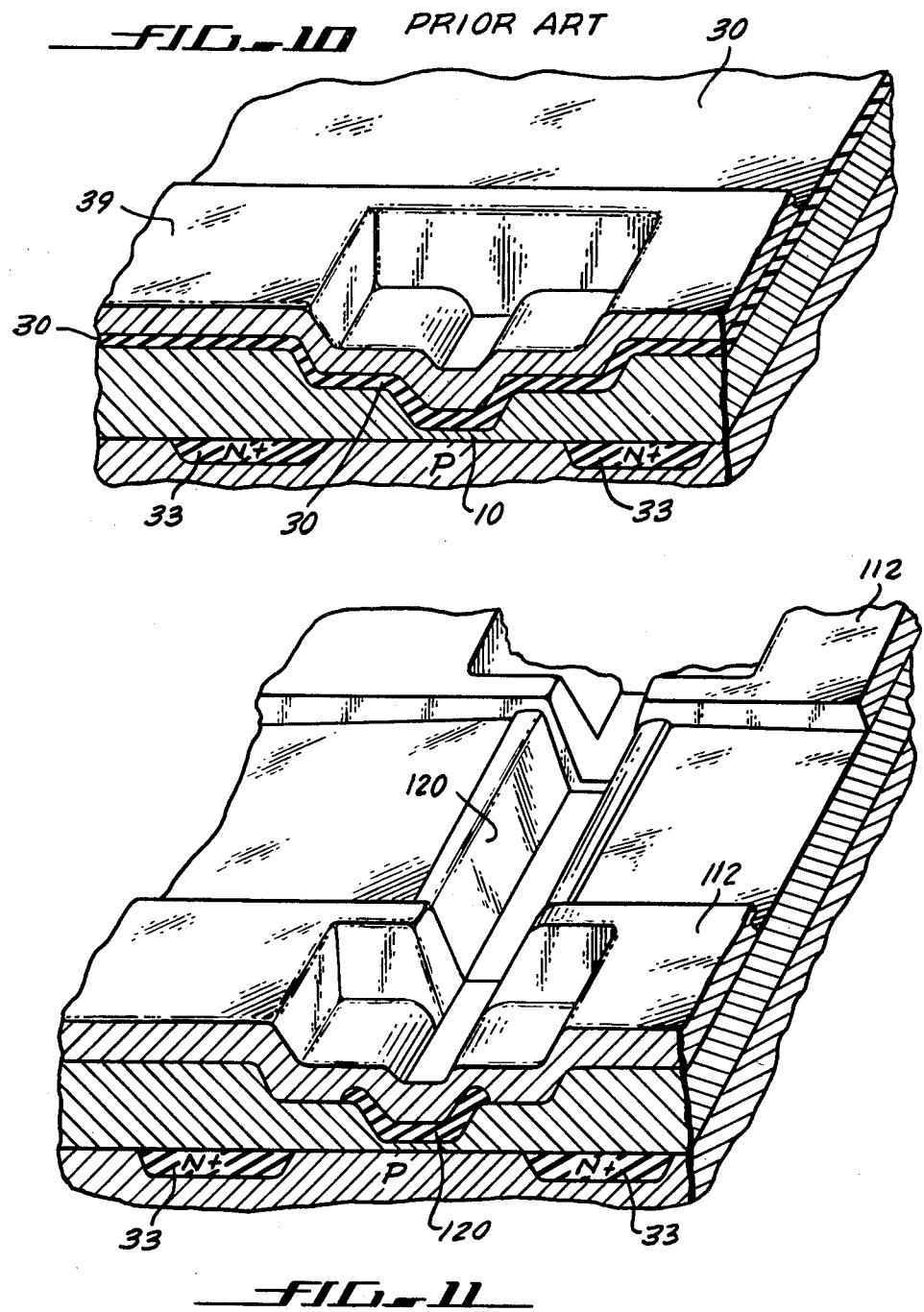
FIG. 10 is a partial cross-sectional view of the prior art contact hole structure.
FIG. 11 is a partial cross-sectional view of the instant invention contact hole structure.

FIG. 1, FIG. 2 and FIG. 10 are prior art structures showing the placement of the normal thin MNOS gate oxide 10, generally 15 to 25 Angstroms, and MOS gate oxide 20, generally 200 to 1000 Angstroms, and the silicon nitride layers 30, typically 200 to 800 Angstroms, in both the MNOS structure of FIGS. 1 and 10 and the MOS structure of FIG. 2. A layer of metalization 39 covers both types of gates. Typically when both MNOS memory transistors and the nonmemory MOS transistors are fabricated on a common substrate 100 the necessary silicon nitride layer required for the MNOS memory transistor is also deposited over the normal nonmemory transistor area. In order to prevent the nonmemory transistor from exhibiting instability with regard to the threshold levels, the present technique is to make the normal gate oxide 20 thick (on the order of 400 to 1000 Angstroms) with respect to the dual dielectric layer, although such is not shown relatively due to the drawing limitations. This fixes the geometry of the nonmemory transistor to a specific minimum physical dimension. As can be readily noted, a reduction in the size of the specific nonmemory device would cause the normal gate oxide 20 to shrink along with the size of the device itself. As a consequence when the device is extremely small the normal gate oxide 20 will be a very thin oxide and the nonmemory transistor will tend to exhibit MNOS characteristics.

Figure 3:
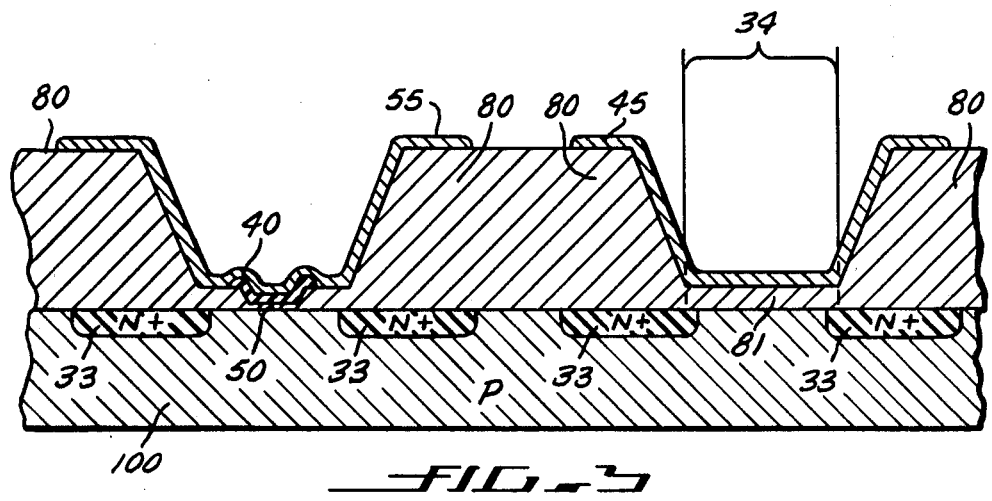
FIG. 3 is a partial cross-sectional view of the MNOS and MOS structure of the instant invention.

As shown in FIG. 3, the improved structures illustrate the MNOS memory transistor structure having the silicon nitride layer 40 disposed over the thin oxide 50 portion of the gate away from the diffused regions 33 and removed from all the other locations in the transistor including the field region 80 and the true MOS nonmemory transistor showing a total absence of the silicon nitride which may be fabricated on a common substrate 100 with the improved MNOS memory transistor. Conventional metal contacts 45, 55, typically of aluminum, are provided over the MOS nonmemory transistor and the MNOS memory transistor, respectively. The two structures of FIG. 3 are shown enlarged for greater detail in FIGS. 4 and 5. The silicon nitride stripping process leaves the normal gate oxide 81 of the gate region 34 free of silicon nitride. Since the operation of both the MNOS nonmemory transistor and the true MOS memory transistor are now independent of device geometry due to the stripping of the silicon nitride from the common oxide layer in those areas where it is not needed, each device may be separately optimized. It should be recognized that both metal oxide gates, FIG. 6, and silicon gate structures, FIG. 7, may be fabricated using the process herein described.

Figure 6:
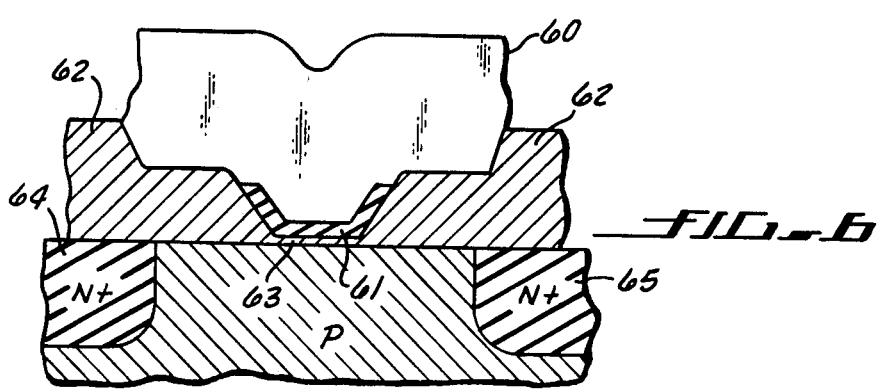
FIG. 6 is a partial cross-sectional view of the ideal MNOS gate area of the instant invention.

In FIG. 6 a metal contact 60 is shown overlapping the nitride gate dielectric 61. Adjacent said silicon nitride dielectric are silicon dioxide field regions 62 on either side of a gate dielectric 63 also comprising silicon dioxide. FIG. 7 is an illustration of the silicon gate structure as opposed to the metal gate structure of FIG. 6. In FIG. 7 it is to be noted that there is a layer of metalization 70 in contact with the silicon structure 71 which is doped for conductivity. The silicon structure is also partially covered with a silicon dioxide layer 78 which is the typical resultant structure. The silicon gate overlaps the silicon nitride dielectric layer 72 while the silicon dioxide field regions 73 are essentially fabricated similar to those regions 62 of FIG. 6. Similarly, the thin silicon dioxide gate region 74 is disposed generally in the same manner as region 63 of FIG. 6. Source and drain regions 75 and 76, respectively, are shown disposed beneath the field region in the substrate away from the silicon nitride dielectric layer. Similarly, in FIG. 6, there are corresponding source and drain regions 64 and 65, respectively, similarly disposed. As may be noted when the specific size of the geometry of either of these two devices shrinks, the silicon nitride layer remains essentially in the gate region and does not result in a dielectric interface region directly over either the source or the drain which could cause the trapping of charges and conduction. However, as seen in FIGS. 1 and 2 when the geometry of the prior art devices shrinks, then the normal gate oxides 31 and 32 likewise tend to become smaller thus allowing the dielectric interface to approach the source and drain respectively. It should be noted that in regions 35 of FIG. 1 the reduction of the dielectric 31 will cause the same structural relationship as size decreases as is intended by the gate dielectric 10. Thus charges can become trapped at the dielectric interface. The trapped charges will adversely affect the diode breakdown voltage of the drain and source as well as interfere with the threshold stability.

Further, in the case of the MOS device of FIG. 2, as the dielectric 20 in the gate region 34 becomes thinner the device will tend to exhibit threshold instabilities due to its MNOS characteristics, as well as diode breakdown.

Figure 4:
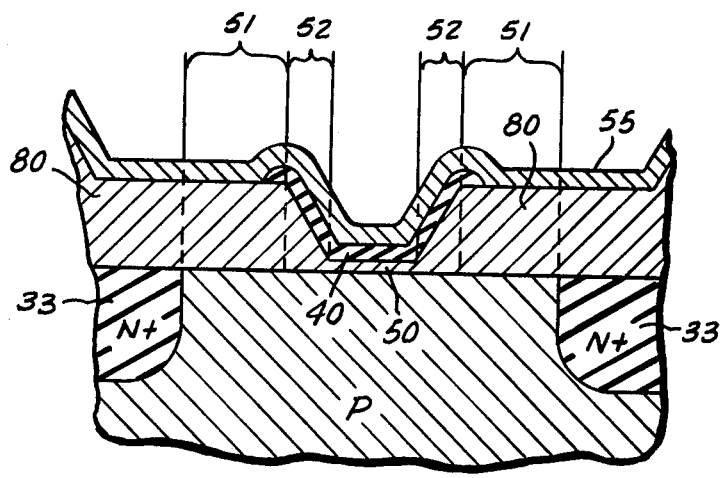
FIG. 4 is a partial cross-sectional view of the MNOS gate area of the instant invention.
Figure 5:
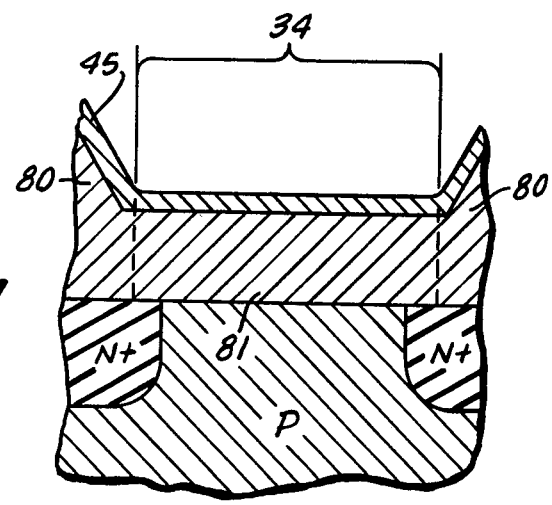
FIG. 5 is a partial cross-sectional view of the MOS gate area of the instant invention.

In the instant invention, however, the resulting gate regions as shown in FIGS. 4 and 5 are so structured as to avoid the above instability and breakdown problems. As the device geometry shrinks in the instant device the field dielectric 80 also shrinks, however, since the nitride layer is not disposed over the source or drain regions 33 and therefore cannot trap charges, undesirable conduction does not occur. In fact, as will be noted in FIG. 4, the silicon nitride layer 40 remains removed from the source and drain in regions 51, thus maintaining a relatively fixed oxide distance between the nitride 40 and the diffused regions 33.

Finally, since device geometry is no longer fixed, the effect of the sidewalk regions 52 becomes less as the geometry shrinks because the slope becomes less as size becomes smaller. Thus, the device tends towards theoretical operation.

As may be readily noted in FIG. 5, the MOS operation is improved because as the dielectric 81 in the gate region shrinks no instability can result due to the dielectric interface because there is none. Thus, here characteristics are also governed by the theoretical MOS structure.

It should be noted that the MOS operation is improved even in the absence of reduced size because charges cannot accumulate at the dielectric interface of the gate over extended periods of time as in prior art structures. This therefore eliminates the long term reliability problems created by a variable threshold.

In addition, FIGS. 8 and 9 illustrate both prior art contact holes and those of the instant invention. When contact holes are required in prior art structures, FIG. 8, an opening must first be etched in the silicon nitride layer 100. Thereafter, a different etchant is required for the underlying silicon dioxide layer 101. This different etchant does not affect the silicon nitride and therefore tends to dissolve away silicon dioxide beneath the silicon nitride as it also works its way downward, creating a ledge 90. Not only is this ledge fragile, thus subject to breakage which may contaminate other areas of the chip in process, but also it allows the accumulation of debris 92 before a metalization layer 102 is deposited thereon. Depending on the particular contaminant, adverse threshold levels can be experienced or undesirable conduction between the substrate 104 and diffused regions 103 can occur.

This problem is eliminated in the present structure shown in FIG. 9 where the metal contact 105 engages the diffused region 106 through the oxide 107 without the creation of any ledges; thus no adverse conduction to the substrate 108 can occur.

Even more important, fracture lines 109 in the aluminum contact 102 deposited over the contact hole are eliminated. In prior art structure/fracture of the ledge 90 during metalization would cause a break in the contact circuit and allow aluminum to fall into the contact hole with the ledge, thereby leaving a gap between the aluminum in the contact hole and that on the nitride. With the nitride removed, however, a smooth transistion from the surface into the contact hole prevents such fracture lines.

In FIG. 11, the new process allows an elongated strip of silicon nitride 120 to remain across the surface of the device which passes through the gate area of the MNOS device. Metalization strips 112, configured to conform to the shape of the silicon nitride strips 120 and the oxide layer, provide the contacts for the respective individual devices. Such strips are preferred over small rectangles in that, when the silicon nitride layers are coated with photoresist for subsequent mask development, all small rectangles may not be completely or correctly exposed. Later etch of the photoresist could cause the removal of such incorrectly exposed rectangles which, when followed by a nitride etch step, causes removal of nitride from some memory gates, thereby making the device inoperable. In addition, it is very difficult to determine by inspection whether or not some of the literally thousands of small rectangles are missing. With the strip method, however, photoresist development is much simpler and later inspection likewise greatly simplified. Yield is increased due to the fact that a poorly developed portion of the strip will allow attach of the nitride from only two sides. In the case of a rectangle, the underlying nitride is attacked from four sides with the increased likelihood of etching away of a greater portion of the nitride.

In addition, the photoresist rectangle itself may fracture or break away, even if fully developed, due to the undermining of the rectangle from four sides, and migrate about the surface of the device as a contaminant or even result in a masking of nitride, for example, causing unwanted structures elsewhere in the final product. When exposed in long strips, however, greater strength and adherence, as well as limitation of the undermining attack to only two sides, prevent such fracture or breakaway.

Accordingly, the absence of ledges and indeed of numerous tiny rectangles of photoresist prevents fractures and migration of contaminants or unwanted masks and therefore improves the yield of not only the MNOS device being fabricated but also surrounding circuitry. Therefore, both MNOS and MOS devices may be constructed simultaneously on the same substrate while providing contact holes and the like but eliminating undercut structures and fragmentation of silicon nitride structures and photoresist masks in the gate area as previously described.

It should be noted, of course, that the structure relates to N as well as P type substrates; and thus the particular conductivity or polarity of the device is independent of structure or the improved process. Further, the contact portion of the gate may of course be either metal or silicon as indicated before. In addition, the silicon nitride strip need not be actually continuous but where necessary may be interrupted, so long as the interruption minimizes photoresist fracture potential while still allowing sufficient adherence and imparting strength to the layer in the gate area during processing.

PROCESS OF MANUFACTURE

To implement this invention, a nitride stripping step is incorporated into the complete MNOS processing sequence of steps which is well known in the prior art. The additional nitride stripping steps for successful implementation of this invention are as follows: apply a photoresist masking step to define a strip of silicon nitride that lies over the gate of the MNOS transistor; then etch the surface of the device such that silicon nitride strips remain in the gate area; strip the photoresist from the device; clean the device; inspect the mask etch result.

The example process does not limit the usefulness or the application of this invention to a metal gate N channel MNOS process. Other processes include but are not limited to metal P channel MNOS, silicon gate N channel MNOS, and silicon gate P channel MNOS, as shown in FIGS. 6 and 7. In addition, this invention is applicable to other than silicon technology, such as in the case of gallium arsenide substrates as described before.

I claim:

1. A method for fabricating a semiconductor device to develop a plurality of discrete transistor elements on a common substrate by providing a body of silicon having a region of one conductivity type, diffusing regions of opposite conductivity type adjacent a gate region, providing a thin oxide layer over said gate region, providing a thick field oxide layer over the remainder of said silicon, layering silicon nitride over said oxide and providing contacts for said gate regions and said diffused regions wherein the improvement comprises: the additional step of stripping the silicon nitride from selected portions of the surface of the device such that the nitride remains on the surface of the device in a strip extending through the gate regions of a plurality of the transistor elements prior to fixing contacts thereon.

2. The process as described in claim 1 wherein said additional step further comprises:
   a. the application of a photoresist on the layer of silicon nitride,
   b. exposing the photoresist such that elongated strips thereof will mask the nitride in the gate region,
   c. etching away all silicon nitride on the surface of the device except that protected by the mask, and
   d. stripping away the photoresist mask.

3. A method of fabricating MNOS and MOS transistors on the same substrate which are independently optimized combining the steps of:
   a. forming on a semiconductor substrate a first layer of dielectric material over a first semiconductive material of one conductivity type,
   b. forming a layer of second dielectric material consisting of silicon nitride on preselected portions of said first dielectric over the first layer and extending between adjacent MNOS transistors, and
   c. forming diffused regions in said first semiconductive material of opposite conductivity and spaced apart laterally from said second dielectric layer.

4. A method as described in claim 3 wherein said second dielectric forming step further comprises:
   a. forming said second dielectric material over the entire surface of said first dielectric,
   b. selecting certain areas of the first dielectric for use as MNOS gates, and
   c. removing said second dielectric from all areas of said first dielectric except for strips connecting those areas selected as the MNOS gates.

5. The method of claim 3 wherein the step for forming said first dielectric layer further comprises:
   a. forming a first layer of first dielectric material over a portion of said first semiconductive material,
   b. selecting a plurality of regions as a gate area,
   c. forming a first region in at least one first gate area of thin dielectric thickness relative to said first layer,
   d. forming a second region in said first gate area of intermediate dielectric thickness relative to said first layer, and
   e. forming a region in at least one second gate region of intermediate dielectric thickness relative to said first layer.

6. The method of claim 5 wherein said second dielectric forming step further comprises the steps of:
   a. depositing said second dielectric material over the entire surface of the first dielectric material,
   b. removing said second dielectric from all second gate regions, at least a portion of the surface of said first dielectric layer and at least a portion of said second region of said first gate overlying said diffused regions.

7. The method of claim 6 wherein said second dielectric is removed such that elongated strips of said second dielectric remain in said first gate regions.

8. The method of claim 7 wherein said second dielectric strips interconnect at least adjacent first gate regions.

* * * * *